US011075469B2

(12) United States Patent
Huh et al.

(10) Patent No.: US 11,075,469 B2
(45) Date of Patent: Jul. 27, 2021

(54) APPARATUS AND METHOD FOR OUTPUTTING BEAMFORMING SIGNAL BASED ON STATE OF ELECTRONIC DEVICE

(71) Applicant: Samsung Electronics Co., Ltd., Suwon-si (KR)

(72) Inventors: Jaeyoung Huh, Suwon-si (KR); Sanghyun Chang, Suwon-si (KR); Seunggil Jeon, Suwon-si (KR); Wonjoon Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 43 days.

(21) Appl. No.: 16/717,399

(22) Filed: Dec. 17, 2019

(65) Prior Publication Data

US 2020/0194904 A1 Jun. 18, 2020

(30) Foreign Application Priority Data

Dec. 17, 2018 (KR) ........................ 10-2018-0162761

(51) Int. Cl.
*H01Q 21/24* (2006.01)
*H01Q 5/28* (2015.01)
(Continued)

(52) U.S. Cl.
CPC .............. *H01Q 21/24* (2013.01); *H01Q 5/28* (2015.01); *H01Q 9/26* (2013.01); *H01Q 9/42* (2013.01); *H01Q 21/065* (2013.01); *H05K 1/118* (2013.01)

(58) Field of Classification Search
CPC ............ H01Q 5/28; H01Q 21/24; H01Q 9/26; H01Q 9/42; H01Q 21/065
See application file for complete search history.

(56) References Cited

U.S. PATENT DOCUMENTS 6,919,861 B2 7/2005 Miyano et al.
7,525,493 B2 4/2009 Iwai et al.
(Continued)

FOREIGN PATENT DOCUMENTS

EP 3343693 A1 7/2018

OTHER PUBLICATIONS

Extended European Search Report dated Mar. 18, 2020, issued in European Application No. 19217004.1-1220.
(Continued)

*Primary Examiner* — Graham P Smith
(74) *Attorney, Agent, or Firm* — Jefferson IP Law, LLP

(57) ABSTRACT

An electronic device is provided. The electronic device includes a housing including a first portion, a second portion, and a third portion configured to be movable such that the second portion is capable of being folded with respect to the first portion, a first array antenna disposed at the first portion and including a first antenna element and a second antenna element, a second array antenna including a third antenna element and a fourth antenna element, and disposed at the second portion such that the third antenna element is aligned with the first antenna element and the fourth antenna element is aligned with the second antenna element when the electronic device is in a folded state in which the second portion of the housing is folded with respect to the first portion by using the third portion, a communication circuit electrically connected to the first array antenna and the second array antenna, and at least one processor, wherein the at least one processor may be configured to: determine whether the electronic device is in an unfolded state or a folded state based on the second portion being in the unfolded state or folded state with respect to the first portion by using the third portion, when the electronic device is in the unfolded state, form a first beam through the first antenna (Continued)

element and the second antenna element or a second beam through the third antenna element and the fourth antenna element by using the communication circuit, and when the electronic device is in the folded state, form a third beam through the first antenna element and the third antenna element or a fourth beam through the second antenna element and the fourth antenna element by using the communication circuit.

20 Claims, 9 Drawing Sheets

(51) Int. Cl.
    *H01Q 9/26*     (2006.01)
    *H01Q 9/42*     (2006.01)
    *H01Q 21/06*     (2006.01)
    *H05K 1/11*     (2006.01)

(56) References Cited

U.S. PATENT DOCUMENTS

| | | |
|---|---|---|
| 2013/0344907 A1 | 12/2013 | Pan et al. |
| 2015/0011273 A1 | 1/2015 | Wilmhoff et al. |
| 2017/0110786 A1 | 4/2017 | Liu |
| 2017/0237153 A1 | 8/2017 | Chang et al. |
| 2017/0330917 A1 | 11/2017 | Kim et al. |
| 2018/0145718 A1 | 5/2018 | Margomenos |
| 2018/0316379 A1* | 11/2018 | Chang .................. H04B 1/401 |

OTHER PUBLICATIONS

International Search Report dated Apr. 14, 2020, issued in International Application No. PCT/KR2019/017909.
Written Opinion dated Apr. 14, 2020, issued in International Application No. PCT/KR2019/017909.

* cited by examiner

APPARATUS AND METHOD FOR OUTPUTTING BEAMFORMING SIGNAL BASED ON STATE OF ELECTRONIC DEVICE

CROSS-REFERENCE TO RELATED APPLICATION

This application is based on and claims priority under 35 U.S.C. 119 to Korean Patent Application No. 10-2018-0162761, filed on Dec. 17, 2018, in the Korean Intellectual Property Office, the disclosure of which is herein incorporated by reference in its entirety.

BACKGROUND

1. Field

The disclosure relates to an apparatus and a method for outputting a beamforming signal based on a state of an electronic device.

2. Description of the Related Art

In order to meet wireless data traffic demands, which have increased since the commercialization of a $4^{th}$-generation (4G) communication system, efforts have been made to develop an improved $5^{th}$-generation (5G) communication system or a pre-5G communication system. For this reason, the 5G communication system or the pre-5G communication system is called a beyond-4G-network communication system or a post-long-term-evolution (post-LTE) system.

In order to achieve a high data transmission rate, implementation of the 5G communication system in a millimeter-wave (mmWave) band (e.g., a 60 GHz band) is being considered. In the 5G communication system, technologies such as beamforming, massive multiple-input multiple-output (massive MIMO), full-dimensional MIMO (FD-MIMO), array antenna, analog beamforming, and large-scale antenna technologies are being discussed as means to mitigate a propagation path loss in the mmWave band and increase a propagation transmission distance.

Thanks to the development of technology, a user can transform the exterior of an electronic device. For example, the user may fold or unfold an electronic device. The electronic device may include an antenna for performing wireless communication. The antenna may be disclosed at a fixed position in the electronic device so as to transmit or receive a signal. When the electronic device is folded, the performance of the antenna disposed at the fixed position may be degraded. Therefore, a solution may be required to perfume communication while preventing antenna performance degradation even though the exterior of the electronic device is transformed.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide the technical problem to be solved by the disclosure is not limited to the above-mentioned technical task, and other technical tasks that have not been mentioned may be clearly understood through the following description by those skilled in the art to which the disclosure belongs.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first portion, a second portion, and a third portion configured to be movable such that the second portion is capable of being folded with respect to the first portion, a first array antenna disposed at the first portion and including a first antenna element and a second antenna element, a second array antenna including a third antenna element and a fourth antenna element, and disposed at the second portion such that the third antenna element is aligned with the first antenna element and the fourth antenna element is aligned with the second antenna element when the electronic device is in a folded state in which the second portion of the housing is folded with respect to the first portion by using the third portion, a communication circuit electrically connected to the first array antenna and the second array antenna, and at least one processor, wherein the at least one processor may be configured to: determine whether the electronic device is in an unfolded state or a folded state based on the second portion being in the unfolded state or folded state with respect to the first portion by using the third portion, when the electronic device is in the unfolded state, form a first beam through the first antenna element and the second antenna element or a second beam through the third antenna element and the fourth antenna element by using the communication circuit, and when the electronic device is in the folded state, form a third beam through the first antenna element and the third antenna element or a fourth beam through the second antenna element and the fourth antenna element by using the communication circuit.

In accordance with another aspect of the disclosure, an electronic device is provided. The electronic device includes a first portion including a first array antenna and a third array antenna, a second portion including a second array antenna and a fourth array antenna, a third portion connecting the first portion and the second portion and configured to rotate at least one of the first portion or the second portion, at least one sensor configured to detect a folded state of the electronic device or an unfolded state of the electronic device, a memory configured to store a code book corresponding to the folded state, and at least one processor configured to: acquire sensor data indicating one of the unfolded state or the folded state from the at least one sensor, determine, based on the sensor data, that the electronic device is in the folded state, deactivate the third array antenna and the fourth array antenna based on the determination, and form, based on the code book corresponding to the folded state, a beam by using the first array antenna included in the first portion and the second array antenna included in the second portion as one array antenna.

The electronic device according to an embodiment may perform beamforming by using an array antenna configured to form a beam toward a side surface of the electronic device instead of an array antenna configured to form a beam toward the rear surface of the electronic device, and thus may perform communication when the electronic device is in a folded state.

The electronic device according to an embodiment may perform beamforming by using two parallel-arranged side array antennas in a folded state thereof, and thus may acquire improved beam coverage in the folded state of the electronic device.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
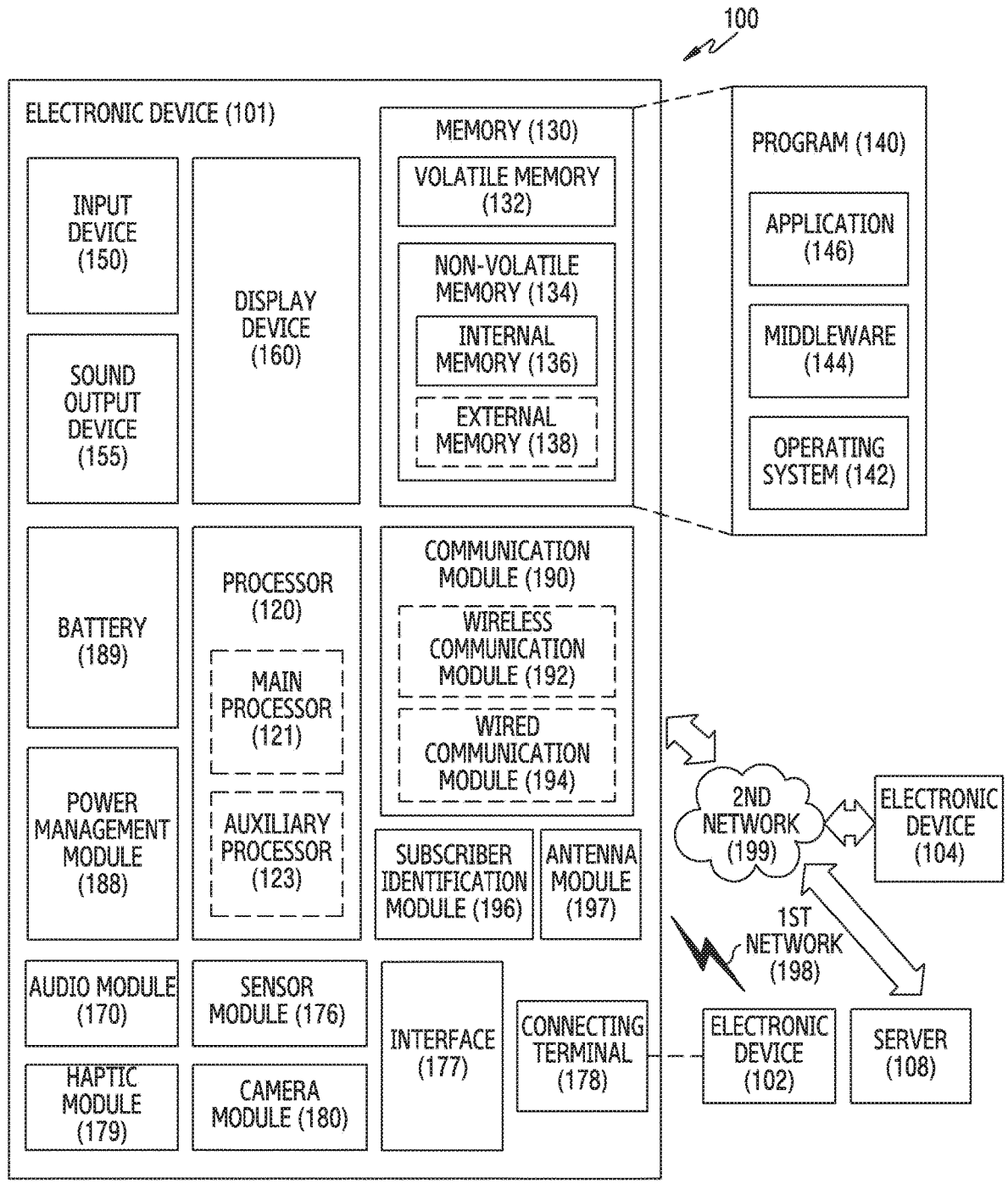
FIG. 1 is a block diagram of an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., printed circuit board (PCB)). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, and without limitation, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
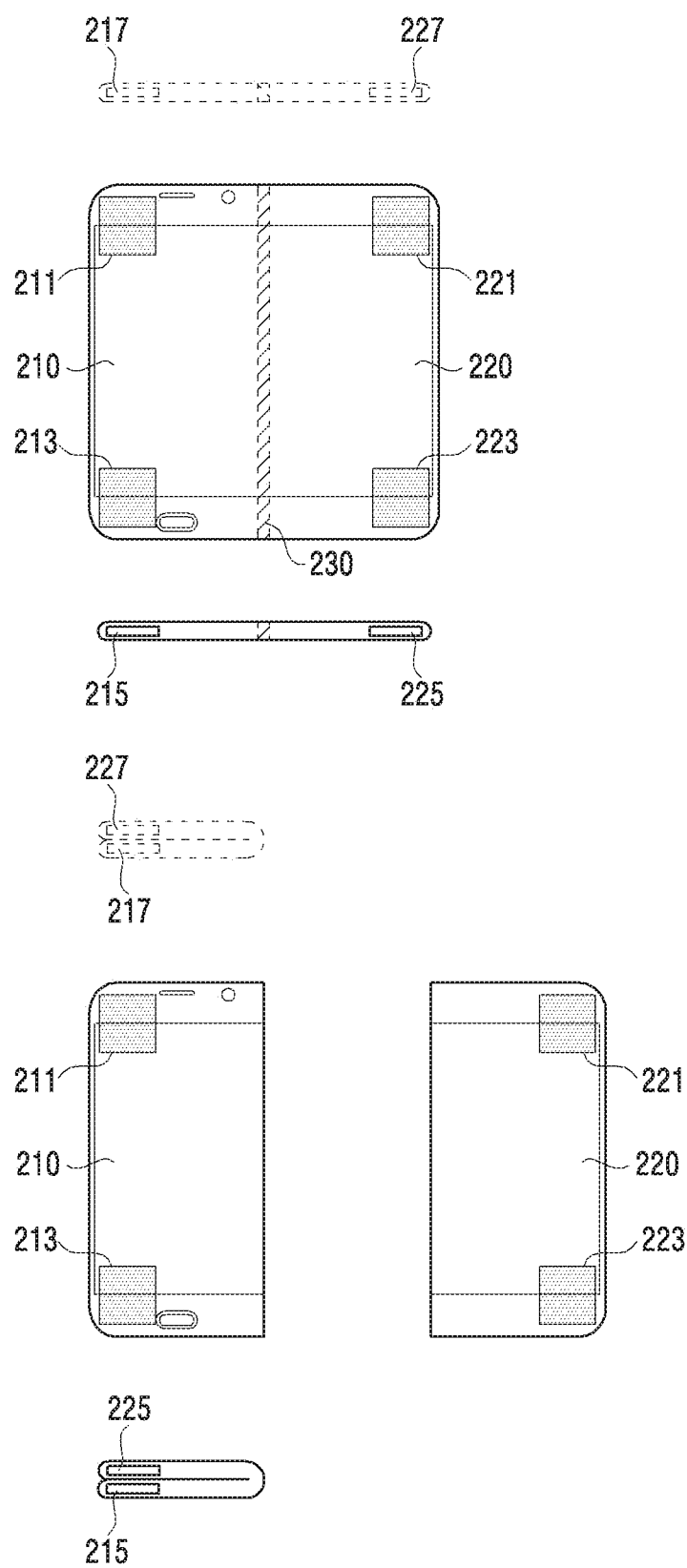
FIG. 2 is a diagram illustrating an unfolded state or a folded state of an electronic device according to an embodiment of the disclosure.

FIG. 2 is a diagram illustrating an unfolded state or a folded state of an electronic device 101 according to an embodiment of the disclosure.

Referring to FIG. 2, the electronic device 101 according to an embodiment may include a housing (not shown), a first array antenna 215, a second array antenna 225, a third array antenna 211, and a fourth array antenna 221.

According to an embodiment, the housing (not shown) may form the exterior of the electronic device 101. The housing (not shown) may include a first portion 210, a second portion 220, and a third portion 230.

According to an embodiment, the first portion 210 may include a portion of the housing. For example, the first portion 210 may correspond to a left portion of the housing (not shown). According to an embodiment, the first portion 210 may be functionally connected to another portion of the housing (not shown) through the third portion. According to an embodiment, the first portion 210 may include a first surface on which a display is disposed, a second surface facing the direction opposite the direction faced by the first surface, and a side surface connecting the first surface to the second surface. According to an embodiment, the first portion 210 may include the first array antenna 215, the third array antenna 211, and a fifth array antenna 213 (omissible depending on the implementation). For example, the first array antenna 215 may be disposed at the side surface of the first portion 210, and the third array antenna 211 and the fifth array antenna 213 may be arranged underneath the second surface. Depending on the implementation, a seventh array antenna 217 may be further disposed at another side surface opposite to the side surface connecting the first surface to the second surface.

According to an embodiment, the second portion 220 may include another portion distinguished from the portion of the housing (not shown). For example, the second portion 220 may correspond to a right portion of the housing (not shown). According to an embodiment, the second portion 220 may be functionally connected to the first portion 210 through the third portion 230. According to an embodiment, the second portion 220 may include a third surface on which a display (not shown) is disposed, a fourth surface facing the direction opposite the direction faced by the third surface, and a side surface connecting the third surface to the fourth surface. According to an embodiment, the second portion 220 may include the second array antenna 225, the fourth array antenna 221, and a sixth array antenna 223 (omissible depending on the implementation). For example, the second array antenna 225 may be disposed at the side surface of the second portion 220, and the fourth array antenna 221 and the sixth array antenna 223 may be disposed underneath the fourth surface. Depending on the implementation, an eighth array antenna 227 may be further disposed at another side surface opposite to the side surface of the second portion 220 connecting the third surface to the fourth surface.

According to an embodiment, the third portion 230 may connect the first portion 210 and second portion 220 to each other. For example, the third portion 230 may be configured to couple the side surface of the first portion 210 and the side surface of the second portion 220 opposite to the side surface of the first portion 210 so as to connect the first portion 210 and the second portion 220 such that at least one of the first portion 210 or the second portion 220 can be rotated. According to one embodiment, the third portion 230 may be referred to by various terms including "hinge", "swivel", "folding portion", "rotating portion".

According to an embodiment, the electronic device 101 is capable of being folded with reference to the third portion 230. For example, the third portion 230 may be disposed between the first portion 210 and the second portion 220 of the electronic device 101 such that the electronic device 101 is capable of being folded or unfolded. In an embodiment, the first portion 210 or the second portion 220 may be capable of rotating using the third portion 230 as a shaft. For example, the first portion 210 and the second portion 220 may be capable of rotating to face each other by using the third portion as a shaft. The state in which the first portion 210 and the second portion 220 face each other may be referred to as the folded state of the electronic device 101. In the folded state, the second surface of the first portion 210 and the fourth surface of the second portion 220 may be in contact with each other. In the folded state, the first surface of the first portion 210 and the third surface of the second portion 220 face opposite directions. For example, in the folded state, the front view of the electronic device 101 may correspond to a display disposed on the first surface of the first portion 210. In the folded state, the rear view of the electronic device 101 may correspond to a display disposed on the third surface of the second portion 220. In an embodiment, the first portion 210 and the second portion 220 may be substantially disposed on or overlap each other.

According to an embodiment, the first surface of the first portion 210 and the third surface of the second portion 220 may form one surface. For example, when the electronic device 101 is in the unfolded state, the first surface and the third surface may form a surface on which a display (not shown) is disposed. The surface on which the display is disposed may be referred to as the front surface of the electronic device 101. According to an embodiment, the second surface of the first portion 210 and the fourth surface of the second portion 220 may form another surface. For example, when the electronic device 101 is in the unfolded state, the second surface and the fourth surface may form another surface facing the direction opposite the direction faced by the surface on which the display (not shown) is disposed. The other surface may be referred to as the rear surface of the electronic device 101. When the electronic device 101 is in the unfolded state, the other surface may include both the third array antenna 211 and the fourth array antenna 221. The third array antenna 211 and the fourth array antenna 221 may be configured to form beams toward the rear surface.

According to an embodiment, the third portion 230 may include at least one sensor. The at least one sensor may be configured to detect the state of the electronic device 101. For example, the at least one sensor may include a sensor including a switch and capable of being disposed at a hinge. The switch may be configured to be opened when the electronic device 101 is unfolded and to be short-circuited when the electronic device 101 is folded. The at least one sensor may transmit a control signal to the processor 120 in response to the short-circuit of the switch. When the control signal is transmitted, the processor 120 may determine that the electronic device 101 is in a folded state.

In another example, the at least one sensor may include magnetic sensors. The magnetic sensors may be arranged on the first portion 210 and the second portion 220, respectively. The magnetic sensors may be arranged on the first portion 210 and the second portion 220, respectively, so as to face each other when the electronic device 101 is folded with reference to the third portion 230. When the electronic device 101 is folded, the magnetic sensors may detect the magnetic force generated between a magnetic sensor disposed at the first portion 210 and a magnet disposed at the second portion 220, and may transmit information regarding the magnetic force to the processor 120. Based on sensor data related to the magnetic force acquired from the magnetic sensor, the processor 120 may determine whether the electronic device 101 is in a folded or unfolded state.

In the above-described embodiments, the at least one sensor has been described as including the sensor, which includes the switch and can be disposed at the hinge, and the magnetic sensors, but is not limited thereto. The at least one sensor may include multiple sensors configured to detect the transformation of the exterior of the electronic device 101. For example, the at least one sensor may include a six-component sensor.

In an embodiment, the first portion 210 may include a first surface and a second surface facing away from the first surface. The first portion 210 may include the first array antenna 215 and the third array antenna 211. According to the above-described embodiment, the first array antenna 215 and the third array antenna 211 are shown as separate array antennas, but are not limited thereto. For example, the first array antenna 215 and the third array antenna 211 may be arranged to be integrated into a single antenna module.

In an embodiment, the first array antenna 215 of the first portion 210 and the second array antenna 225 of the second portion 220 may be configured to form beams toward a side surface of the electronic device 101. An array antenna configured to form a beam toward the side surface may be referred to as a side antenna. According to an embodiment, the first array antenna 215 and the second array antenna 225 may include multiple antenna elements. Each of the multiple antenna elements may correspond to a dipole antenna. For example, each of the first array antenna 215 and the second array antenna 225 may correspond to a 1×2 array antenna including a first antenna element and a second antenna element. The 1×2 array antenna may include two dipole antenna elements (e.g., the first antenna element and the second antenna element) arranged in a line along the side surface of the housing of the electronic device 101. In another example, each of the first array antenna 215 and the second array antenna 225 may correspond to a 1×4 array antenna. The 1×4 array antenna may include four dipole antenna elements arranged in a line along the side surface of the housing of the electronic device 101.

In an embodiment, the third array antenna 211 and the fourth array antenna 221 may be configured to form beams toward the rear surface of the electronic device 101. In the unfolded state of the electronic device 101, the rear surface may be referred to a surface facing the direction opposite the direction faced by the front surface on which the display is exposed. An array antenna configured to form a beam toward the rear surface may be referred to as a rear antenna. According to an embodiment, the third array antenna 211 and the fourth array antenna 221 may include multiple antenna elements. Each of the multiple antenna elements may correspond to a patch antenna. For example, each of the third array antenna 211 and the fourth array antenna 221 may correspond to a 4×4 array antenna. The 4×4 array antenna may be disposed in a predetermined region of the housing (not shown) of the electronic device 101 so as to face the rear surface of the electronic device 101. For example, the predetermined region may correspond to a corner region of the electronic device 101.

In the above-described embodiments, the first array antenna 215 and the second array antenna 225 have been described as array antennas including multiple dipole antenna elements, and the third array antenna 211 and the fourth array antenna 221 have been described as array antennas including multiple patch antenna elements. However, the descriptions are not limited thereto. The first array antenna 215 to the fourth array antenna 221 may include multiple antenna elements. For example, each of the first array antenna 215 and the second array antenna 225, configured to form beams toward the side surface of the electronic device 101, may correspond to one of a 1×2 array antenna, a 1×4 array antenna, and a 1×8 array antenna. In another example, each of the third array antenna 211 and the fourth array antenna 221, configured to form beams toward the rear surface of the electronic device 101, may correspond to one of a 2×2 array antenna, a 4×4 array antenna, and an 8×8 array antenna.

Figure 3:
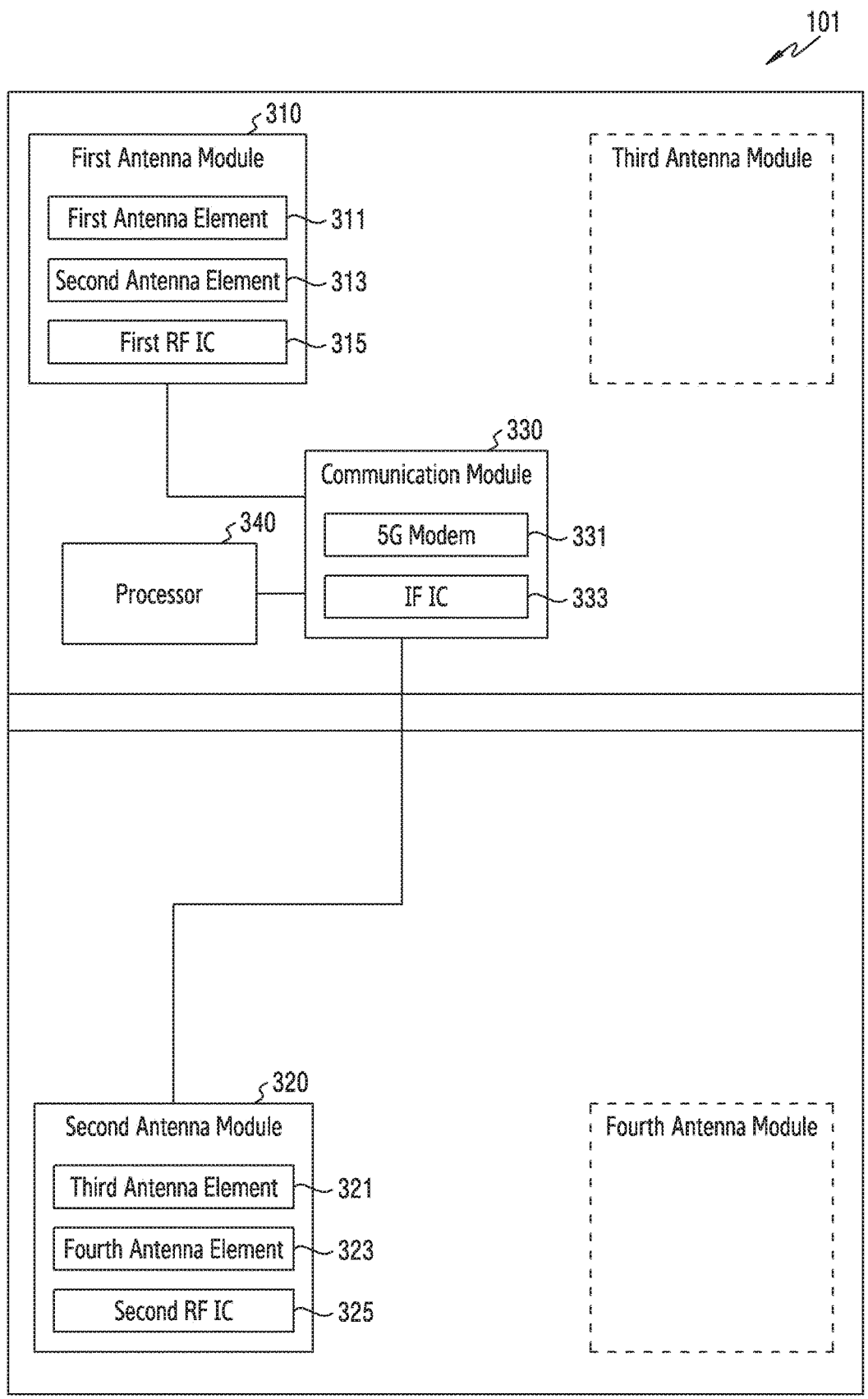
FIG. 3 is a diagram illustrating a functional configuration of an electronic device according to an embodiment of the disclosure.

FIG. 3 is a diagram illustrating a functional configuration of an electronic device according to an embodiment of the disclosure.

Referring to FIG. 3, the electronic device 101 may include a first antenna module 310, a second antenna module 320, a communication module 330, and a processor 340.

According to an embodiment, the first antenna module 310 may include a first antenna element 311, a second antenna element 313, and a first radio-frequency integrated circuit (RFIC) 315. The first antenna element 311 and the second antenna element 313 may be included in the first array antenna 215 illustrated in FIG. 2.

According to an embodiment, the second antenna module 320 may include a third antenna element 321, a fourth antenna element 323, and a second RFIC 325. The third antenna element 321 and the fourth antenna element 323 may be included in the second array antenna 225 illustrated in FIG. 2.

According to an embodiment, the first antenna module 310 may receive an external signal and may convert the frequency band thereof. According to an embodiment, the first antenna module 310 may receive the external signal by using the first antenna element 311 and/or the second antenna element 313. The first antenna element 311 and/or the second antenna element 313 may form reception beams for receiving the external signal. According to an embodiment, the first RFIC 315 may convert the frequency band of the received external signal. For example, the first RFIC 315 may receive the external signal in an mmWave band and may convert the mmWave band into an intermediate frequency (IF) band. The first RFIC 315 may transmit the external signal, the frequency band of which has been converted into the intermediate frequency band, to the communication module 330.

Although not shown, the first antenna module 310 may be disposed on a separate PCB (not shown) different from the main PCB (not shown) on which the processor 340 and the communication module 330 are arranged. The separate PCB may be referred to as a first PCB. The first PCB on which the first antenna module 310 is disposed may be electrically connected to the main PCB through a connection member. The connection member may include a coaxial cable or a flexible PCB (FPCB).

According to an embodiment, the second antenna module 320 may receive an external signal and may convert the frequency band thereof. According to an embodiment, the second antenna module 320 may receive the external signal by using the third antenna element 321 and/or the fourth antenna element 323. The third antenna element 321 and/or the fourth antenna element 323 may form reception beams for receiving the external signal. According to an embodiment, the second RFIC 325 may convert the frequency band of the received external signal. For example, the second RFIC 325 may receive the external signal in an mmWave band and may convert the frequency of the mmWave band into an intermediate frequency band. The second RFIC 325 may transmit the external signal, the frequency band of which has been converted into the intermediate frequency band, to the communication module 330.

Although not shown, the second antenna module 320 may be disposed on a separate PCB (not shown), different from the main PCB (not shown). The separate PCB may be referred to as a second PCB. The second PCB on which the second antenna module 320 is disposed may be electrically connected to the main PCB through a connection member which includes the coaxial cable or the FPCB.

FIG. 3 illustrate an example in which the first antenna module 310 includes two antenna elements (e.g., the first antenna element 311 and the second antenna element 313) and the second antenna module 320 includes two antenna elements (e.g., the third antenna element 321 and the fourth antenna element 323). However, this is merely for convenience of the description. Thus, each of the first antenna module 310 or the second antenna module 320 may include three or more antenna elements.

According to an embodiment, the communication module 330 may include an intermediate frequency integrated circuit (IFIC) 333 and a wireless modem 331. The wireless modem 331 may transmit or receive data to or from the IFIC 333. The wireless modem 331 may be referred to by various terms including "5G modem" and "communication processor (CP)". According to one embodiment, the wireless modem 331 may transmit a digital-to-analog conversion (DAC) signal to the IFIC 333. The DAC signal may correspond to an analog signal obtained by converting a digital signal transmitted from the processor 340 to the wireless modem 331. The analog signal obtained by converting the digital signal may correspond to a signal having a baseband frequency. According to one embodiment, the wireless modem 331 may transmit an analog-to-digital conversion (ADC) signal to the processor 340. The ADC signal may correspond to a digital signal converted from a signal which has been obtained by receiving an analog signal from an external electronic device (e.g., the electronic device 102 and down-converting the frequency of the analog signal and has been received from the IFIC 333.

According to an embodiment, the IFIC 333 may convert a frequency band and may transmit or receive a signal to or from the wireless modem 331. For example, the IFIC 333 may receive a signal, the frequency band of which has been down-converted into an intermediate frequency band, from the first RFIC 315 or the second RFIC 325, and may down-convert the frequency of the received signal to a baseband frequency. In another example, the IFIC 333 may receive a baseband signal from the wireless modem 331 and may up-convert the frequency band of the received baseband signal into the intermediate frequency band. According to an embodiment, the wireless modem 331 and the IFIC 333 may be integrated into one module. For example, the wireless modem 331 and the IFIC 333 may be arranged on the main PCB (not shown).

In the above-described embodiments, the electronic device 101 is described as including only the first antenna module 310 and the second antenna module 320, but is not limited thereto. According to an embodiment, the electronic device 101 may further include a third antenna module and a fourth antenna module. Referring to FIG. 3, the third antenna module and the fourth antenna module may correspond to the elements shown by dotted lines, respectively. For example, the third antenna module may include the third array antenna 211 illustrated in FIG. 2, and the fourth antenna module may include the fourth array antenna 221 illustrated in FIG. 2. According to an embodiment, the first antenna module 310 and the second antenna module 320 may be arranged on the side surface of the lower end of the electronic device 101, and the third antenna module and the fourth antenna module may be arranged on the rear surface of the electronic device 101.

For convenience in the description, although not shown in FIG. 3, the electronic device 101 may further include a fifth antenna module including the fifth array antenna 213 illustrated in FIG. 2 and a sixth antenna module including the sixth array antenna 223 illustrated in FIG. 2.

Figure 4:
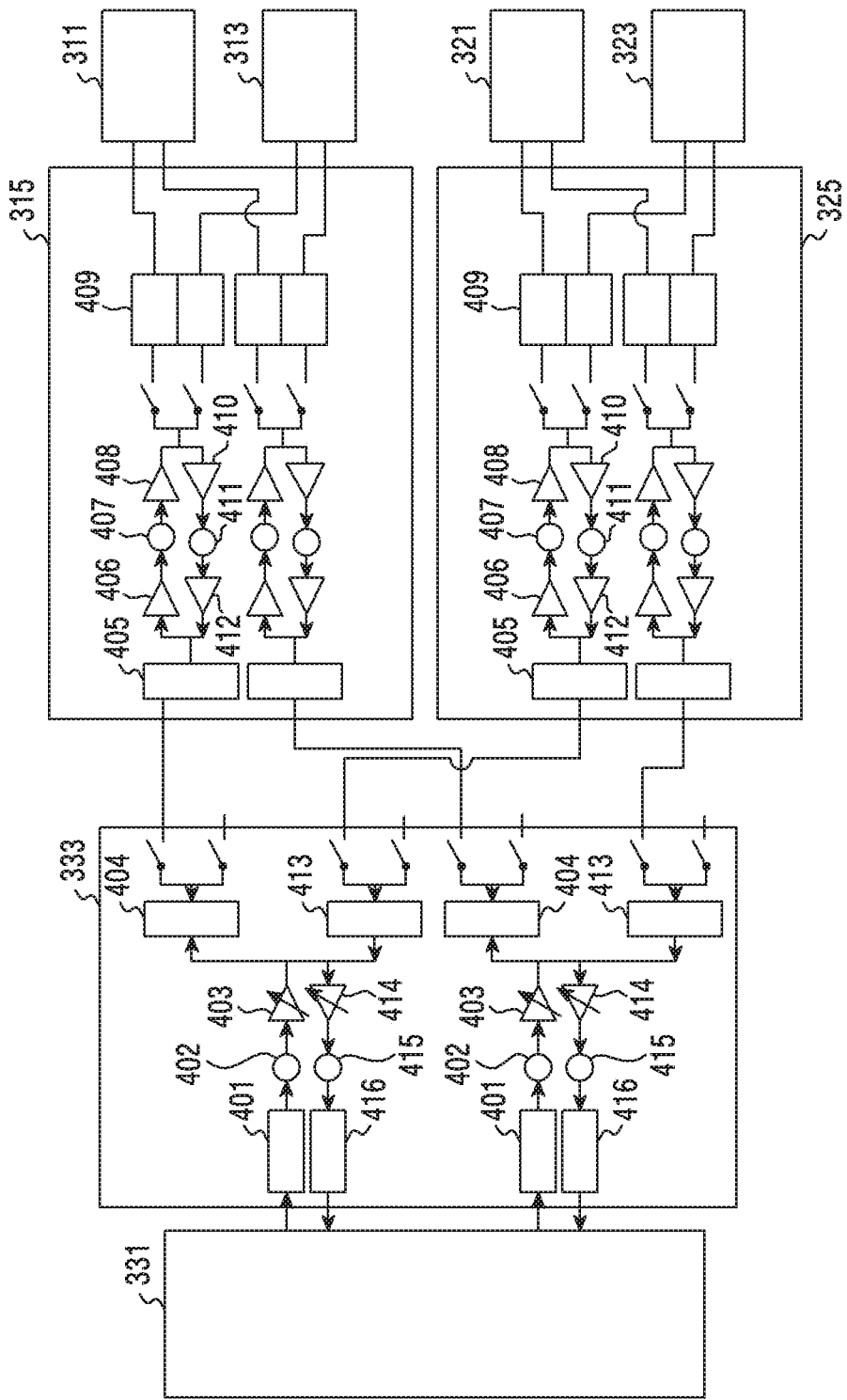
FIG. 4 is a diagram illustrating a configuration of an antenna module and a communication module according to an embodiment of the disclosure.

FIG. 4 is a diagram illustrating a configuration of a communication module and an antenna module according to an embodiment of the disclosure.

Referring to FIG. 4, the wireless modem 331 may transmit a transmission signal to the IFIC 333. The transmission signal may correspond to a DAC signal. The DAC signal may correspond to an analog signal into which the wireless modem 331 has converted a digital signal received from the processor 120.

According to an embodiment, the IFIC 333 may receive the DAC signal from the wireless modem 331 and may up-convert the frequency band of the received signal. The IFIC 333 may include a first variable gain amplifier (VGA) 401, a frequency up-converter 402, a second VGA 403, and a multiplexer (MUX) 404. The first VGA 401 may receive a control signal from the wireless modem 331, and may adjust the gain of the DAC signal. A DAC signal, which has passed through the first VGA 401, may be transmitted to the frequency up-converter 402. The frequency up-converter 402 may include a local oscillator and a transmission mixer. The frequency up-converter 402 may convert a frequency through the transmission mixer on the basis of a local signal generated by the local oscillator. The DAC signal may be up-converted from a baseband frequency to an intermediate frequency band. The up-converted signal may be transmitted to the second VGA 403. The second VGA 403 may adjust the gain of the up-converted signal and may transmit the same to the MUX 404. The MUX 404 may select one RFIC from among multiple RFICs and then transmit the signal having passed through the second VGA 403 to the selected RFIC. According to an embodiment, the IFIC 333 may further include a demultiplexer (DEMUX) 413, a fifth VGA 414, a frequency down-converter 415, and a sixth VGA 416.

According to an embodiment, the selected RFIC may correspond to the first RFIC 315. The signal, which has passed through the second VGA, may be transmitted to a MUX 405 of the first RFIC 315. The MUX 405 may multiplex the transmitted signal into inputs, the number of which corresponds to the number of antenna elements included in an array antenna. Each of the multiplexed inputs may pass through a third VGA 406, a phase shifter 407, and a fourth VGA 408. The third VGA 406 and the fourth VGA

408 may adjust gains of the multiplexed inputs. The phase shifter may adjust a phase value of each antenna element. For example, in a 1×4 array antenna, the array antenna may include four antenna elements, and multiplexed inputs may be imparted with different phase delay values by respective phase shifters. A switch 409 may perform switching for the transmission or reception of a signal. For example, in a time-division multiple access (TDMA) scheme, the transmission and reception of a signal may not be performed at the same time, and switching may thus be required between a path for a transmission signal and a path for a reception signal. According to an embodiment, the first RFIC 315 may further include a seventh VGA 410, a phase shifter 411, and an eighth VGA 412.

Although not shown, the first antenna element 311 to the fourth antenna element 323 may transmit or receive a vertically polarized, horizontally polarized, or dual-polarized signal. Another DAC signal, corresponding to a data stream different from the DAC signal, may be transmitted from the wireless modem 331. The other DAC signal may be transmitted to an array antenna through processing according to the above-described embodiments. For example, the DAC signal may correspond to a signal for generating a vertically polarized signal, and the other DAC signal may correspond to a signal for generating a horizontally polarized signal.

Figure 5:
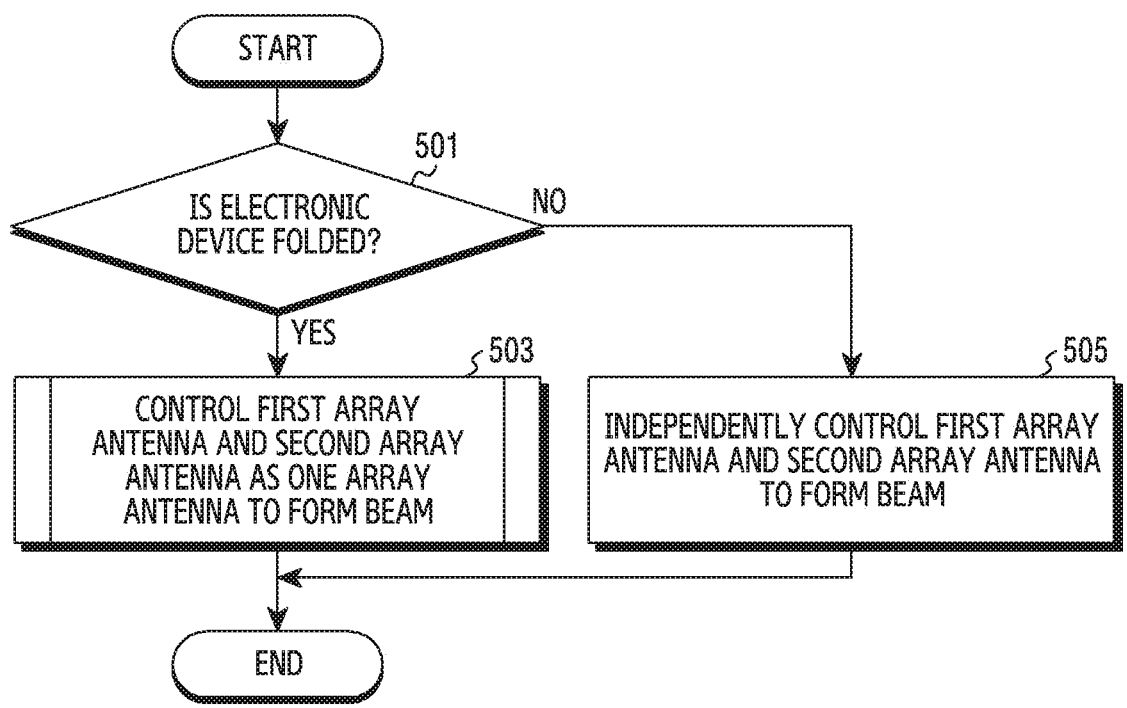
FIG. 5 is a diagram illustrating an operation of an electronic device according to an embodiment of the disclosure.

FIG. 5 illustrates an operation of the electronic device 101 according to an embodiment of the disclosure.

Referring to FIG. 5, in operation 501, the electronic device 101 according to an embodiment may determine whether the electronic device 101 is folded.

According to an embodiment, the processor 120 of the electronic device 101 may acquire sensor data indicating the state of the electronic device from at least one sensor. The state of the electronic device 101 may correspond to one of a folded state or an unfolded state. The at least one sensor may acquire sensor data for determining the folded state or the unfolded state. Referring to FIG. 2, the at least one sensor may be disposed in at least a partial region of the third portion 230. According to an embodiment, the at least one sensor may include a sensor including a switch and capable of being disposed at a hinge, a magnetic sensor, and a six-component sensor.

According to an embodiment, the processor 120 of the electronic device 101 may determine, based on the acquired sensor data, whether the electronic device 101 is in the folded state or in the unfolded state. According to one embodiment, the at least one sensor may include the sensor including the switch and capable of being disposed at the hinge. The switch may be short-circuited when the electronic device 101 is folded, and may be opened when the electronic device 101 is unfolded. When a signal is received from the sensor including the switch, the processor 120 may determine that the switch has been short-circuited. The processor 120 may determine, based on the determination, that the electronic device 101 is in a folded state. In another example, when the signal is not received from the switch, the processor 120 may determine that the switch is opened, and may determine, based on the determination, that the electronic device 101 is in an unfolded state.

According to an embodiment, when it is determined that the electronic device 101 is in the unfolded state, the processor 120 may perform operation 505. The processor 120 may perform operation 503 when it is determined that the electronic device 101 is in the folded state.

In operation 503, the electronic device 101 according to an embodiment may control the first array antenna 215 and the second array antenna 225 as one array antenna to form a beam. According to an embodiment, based on the determined folded state, the processor 120 may transmit, to the communication module 330, control information which instructs the communication module to control the first array antenna 215 and the second array antenna 225 as one array antenna to form a beam.

According to an embodiment, the control information may include code book information. The code book information may be defined as information regarding a set of quantized channel vectors defined in advance. The code book information may be referred to by various terms including "beam book" and "precoding matrix".

According to an embodiment, the processor 120 may make a request to a memory (not shown) for information regarding a code book corresponding to the folded state. The memory (not shown) may contain previously stored code books corresponding to the folded state or the unfolded state. For example, when communication is performed while the electronic device 101 is unfolded (e.g., in the unfolded state), the memory (not shown) may store a code book for providing instruction on operation of the first array antenna 215 to the fourth array antenna 221. In another example, when communication is performed while the electronic device 101 is folded (e.g., in the folded state), the memory (not shown) may store a code book for providing instruction on operation of the first array antenna 215 to the fourth array antenna 221.

According to an embodiment, based on the code book corresponding to the folded state, the electronic device 101 may control the first array antenna 215 and the second array antenna 225 as a single array antenna to form a beam. For example, the code book corresponding to the folded state may include information that instructs the electric device to deactivate the third array antenna 211 and the fourth array antenna 221. The reason therefor may be that the third array antenna 211 and the fourth array antenna 221 are incapable of forming beams when the electronic device 101 is in the folded state. For example, in the folded state, the second surface of the first portion 210 may face the fourth face of the second portion 220. The third array antenna 211 disposed on the second surface may correspond to a patch antenna for forming a beam in a direction perpendicular to the second surface. In the folded state, since the direction perpendicular to the second surface is blocked by the fourth surface, the third array antenna 211 cannot form a beam. In another example, in the folded state, the fourth surface of the second portion may face the second surface of the first portion 210. The fourth array antenna 221 disposed on the fourth surface may correspond to a patch antenna for forming a beam in a direction perpendicular to the fourth surface and opposite to the direction faced by the third surface faces. In the folded state, since the direction perpendicular to the fourth surface and opposite to the direction faced by the third surface faces is blocked by the second surface, the fourth array antenna 221 cannot form a beam.

According to an embodiment, the code book corresponding to the folded state may include information that instructs the electronic device to control the first array antenna 215 disposed at the first portion 210 and the second array antenna 225 disposed at the second portion 220 as one array antenna to form a beam. Based on the code book corresponding to the folded state, the electronic device 101 may control the first array antenna 215 and the second array antenna 225 as one array antenna to form a beam.

In operation 505, the electronic device 101 according to an embodiment may independently control the first array antenna 215 and the second array antenna 225 to form beams. According to an embodiment, based on the determined unfolded state, the processor 120 may transmit, to the communication module 330, control information instructing the communication module to independently control the first array antenna 215 and the second array antenna 225 to form a beam.

Figure 6:
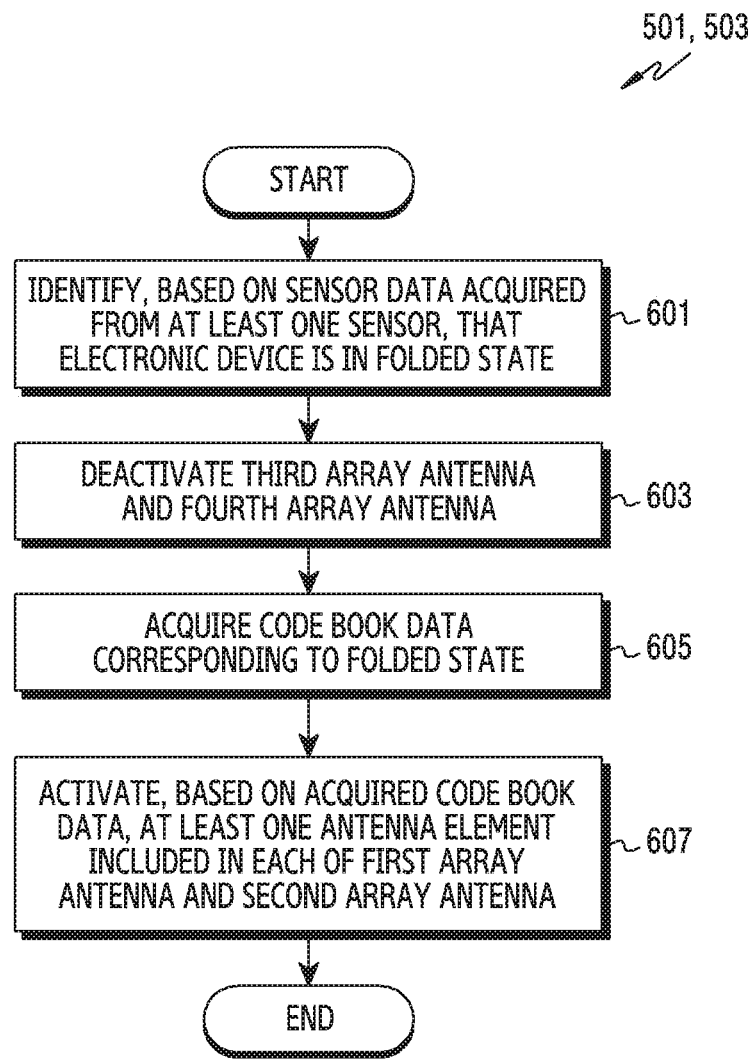
FIG. 6 is a diagram illustrating an operation of an electronic device for generating a beam through a first array antenna and a second array antenna according to an embodiment of the disclosure.

FIG. 6 illustrates an operation of the electronic device 101 for generating a beam through the first array antenna 215 and the second array antenna 225 according to an embodiment of the disclosure.

Operations of the electronic device 101, performed by FIG. 6, may correspond to operations of the electronic device 101 for performing operation 501 and operation 503 illustrated in FIG. 5.

Referring to FIG. 6, in operation 601, the electronic device 101 according to an embodiment may determine, based on sensor data acquired from at least one sensor, that the electronic device 101 is in a folded state. The processor 120 of the electronic device 101 may acquire the sensor data from the at least one sensor. The at least one sensor may include at least one among a magnetic sensor, a six-component sensor, or a sensor including a switch and capable of being disposed at a hinge of the third portion 230. The sensor data may include at least one of data instructing the short-circuit of the switch corresponding to the folded state, data instructing the attachment of a magnet included in each of the first portion 210 and the second portion 220, or sensor data acquired by the six-component sensor.

In operation 603, the electronic device 101 according to an embodiment may deactivate the third array antenna 211 and the fourth array antenna 221. In response to the determination of the folded state, the processor 120 may store an instruction configured to transmit the control information instructing the electronic device to deactivate the third array antenna 211 and the fourth array antenna 221. The reason therefor is that, when the electronic device 101 is in the folded state, the third array antenna 211 and the fourth array antenna 221 may face each other, and each of the third array antenna 211 and the fourth array antenna 221 may correspond to a patch antenna for forming a beam in a direction perpendicular to the surface on which the same is disposed.

In operation 605, the electronic device 101 according to an embodiment may acquire code book data corresponding to the folded state. A memory (not shown) operationally connected to the processor 120 may store multiple code books. The multiple code books may include a code book corresponding to the folded state and a code book corresponding to the unfolded state. The processor 120 may determine a folded state on the basis of the sensor data acquired from the at least one sensor. On the basis of the determination, the processor 120 may make a request to the memory for information regarding the code book corresponding to the folded state. In response to the request, the memory may transmit, to the processor 120, the information regarding the code book corresponding to the folded state.

In operation 607, the electronic device 101 according to an embodiment may activate, based on the acquired code book data, at least one antenna element included in each of the first array antenna 215 and the second array antenna 225.

According to an embodiment, the first array antenna 215 and the second array antenna 225 may include at least one antenna element. For example, each of the first array antenna 215 and the second array antenna 225 may correspond to a 1×4 array antenna in which four antenna elements are arranged in a line. The four antenna elements may correspond to dipole antennas.

According to an embodiment, the acquired code book data may include code book data for performing beamforming when the electronic device 101 is in the folded state. In order to use the first array antenna 215 and the second array antenna 225 as one antenna array, the code book data corresponding to the folded state may include information indicating a phase change value of the at least one antenna element included in each of the first array antenna 215 and the second array antenna 225.

Figure 7A:
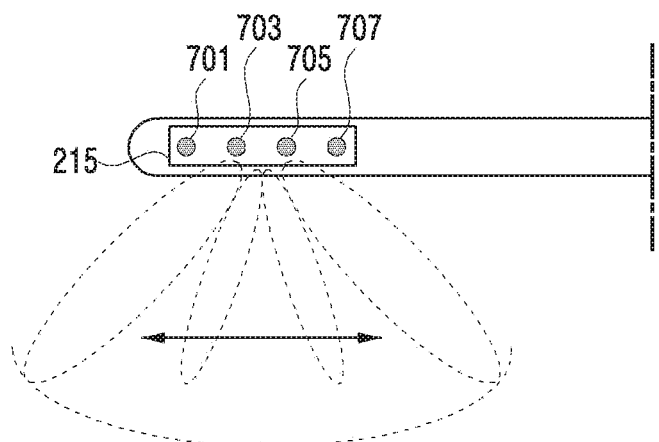
FIGS. 7A and 7B are diagrams illustrating an example of forming a beam according to various embodiments of the disclosure.
Figure 7B:
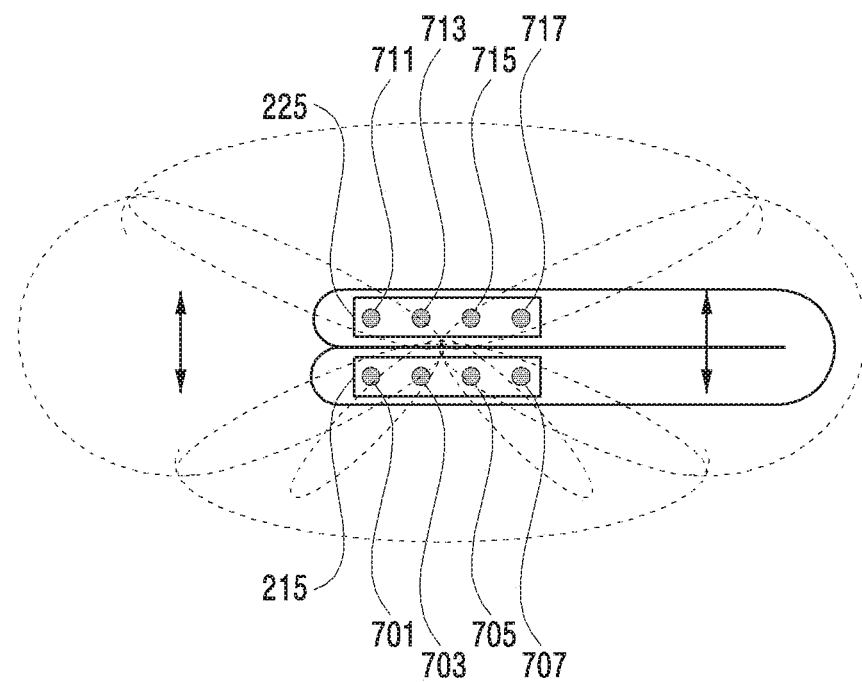

FIGS. 7A and 7B are diagrams illustrating an example of forming a beam according to various embodiments of the disclosure.

FIG. 7A is a diagram illustrating one of the first array antenna 215 and the second array antenna 225 when the electronic device 101 is in an unfolded state. Hereinafter, FIG. 7A may be described as illustrating the first array antenna 215.

Referring to FIG. 7A, the first array antenna 215 may correspond to a side array antenna. For example, the first array antenna 215 may be configured to form a beam toward a side surface. The side surface may include the remaining surface other than: the front surface on which the first surface of the first portion 210 is exposed when the electronic device 101 is in a folded state; and the rear surface on which the third surface of the second portion 220 is exposed when the electronic device 101 is in a folded state.

According to an embodiment, the first array antenna 215 may include multiple elements. The multiple elements may include a first element 701 to a fourth element 707. The multiple elements may correspond to dipole antennas for generating beams toward the side surface. Referring to FIG. 7, the first array antenna 215 may correspond to a 1×4 array antenna.

According to an embodiment, the first element 701 to the fourth element 707 may be arranged to be spaced apart from each other by a predetermined distance. The predetermined distance may be determined based on the frequency of a transmitted/received signal. For example, the predetermined distance may correspond to half of the wavelength of the frequency.

According to an embodiment, each of the multiple elements may include a phase shifter (hereinafter, referred to as "PS"). The first element 701 to the fourth element 707 may include a first PS to a fourth PS, respectively. The first PS to the fourth PS may delay a signal output time so as to adjust the direction of a beam. According to one embodiment, when forming a beam in the side surface direction (the direction coming out of the ground in FIG. 7A), the first array antenna 215 may be configured such that the first PS to the fourth PS have the same phase delay. For example, the first PS to the fourth PS may be configured to have a 0-degree phase delay. In another example, the first PS to the fourth PS may all be configured to have a 180-degree phase delay. According to another embodiment, when the first array antenna 215 forms a beam rotated by 30 degrees in the left direction, the first PS to the fourth PS may be configured to have phase delay values increasing by 30 degrees in the left direction. For example, the first PS may have a phase delay value of 90 degrees, the second PS may have a phase delay value of 60 degrees, the third PS may have a phase delay value of 30 degrees, and the fourth PS may have a phase delay value of 0 degrees. According to another embodiment, when the first array antenna 215 forms a beam rotated by 30 degrees in the right direction, the first PS to the fourth PS may be configured to have phase delay values increasing by 30 degrees in the right direction. For example, the first PS may have a phase delay value of 0 degrees, the second PS may have a phase delay value of 30 degrees, the third PS may have a phase delay value of 60 degrees, and the fourth PS may have a phase delay value of 90 degrees.

According to an embodiment, the direction in which the first array antenna 215 rotates a beam may be limited to a long-axis direction. The long-axis direction may be the direction in which the first element 701 to the fourth element 707 are arranged in a line. For example, referring to FIG. 7A, the long-axis direction may be the left/right direction. Since the rotation of a beam is determined based on phase delay values of the multiple antenna elements, it may be impossible for the first array antenna 215 to rotate in a short-axis direction. For example, referring to FIG. 7A, it may be impossible for the first array antenna 215 to rotate a beam in the upward direction or the downward direction.

According to an embodiment, FIG. 7B illustrates the first array antenna 215 and the second array antenna 225 when the electronic device 101 is in a folded state.

Referring to FIG. 7B, the first array antenna 215 and the second array antenna 225 may be arranged parallel to each other. For example, when the electronic device 101 is in a folded, the second surface of the first portion 210 and the fourth surface of the second portion 220 may be in contact with each other.

According to an embodiment, the second array antenna 225 may include multiple elements. The multiple elements may include a fifth element 711 to an eighth element 717. The fifth element 711 to the eighth element 717 correspond to dipole antennas for generating beams toward a side surface. Referring to FIG. 7, the first array antenna 215 and the second array antenna 225 may correspond to 1×4 array antennas.

According to an embodiment, each of the multiple elements may include a phase shifter (hereinafter, referred to as "PS"). The fifth element 711 to the eighth element 717 may include a fifth PS to an eighth PS, respectively. The fifth PS to the eighth PS may delay a signal output time so as to adjust the direction of a beam generated by the second array antenna 225.

According to an embodiment, the fifth element 711 to the eighth element 717 may be arranged to be spaced apart from each other by a predetermined distance. The predetermined distance may be determined based on the frequency of a transmitted/received signal. For example, the predetermined distance may correspond to half of the wavelength of the frequency.

According to an embodiment, when the electronic device 101 is in the folded state, the first element 701 to the fourth element 707 included in the first array antenna 215 may be aligned with the fifth element 711 to the eighth element 717 included in the second array antenna 225. For example, when the electronic device 101 is in the folded state, the first element 701 may be disposed adjacent to the fifth element 711. In another example, the second element 703 may be disposed adjacent to the sixth element 713. In another example, the third element 705 may be disposed adjacent to the seventh element 715. In another example, the fourth element 707 may be disposed adjacent to the eighth element 717.

According to an embodiment, the first array antenna 215 may be disposed to be spaced apart from the second array antenna 225 by the predetermined distance. For example, the first element 701 and the fifth element 711 may be arranged to be spaced apart from each other by the predetermined distance. The first element 701 may be disposed to be spaced apart from adjacent elements (e.g., the second element 703 of the first array antenna 215 and the fifth element 711 of the second array antenna 225) by the same distance (e.g., the predetermined distance).

According to an embodiment, since the first array antenna 215 and the second array antenna 225 are spaced apart from each other by the predetermined distance, the first array antenna 215 and the second array antenna 225 may operate as one array antenna. That is, the first array antenna 215 and the second array antenna 225 may be arranged adjacent to and parallel to each other so as to operate as a 2×4 array antenna.

According to an embodiment, when the electronic device 101 is in the folded state, the first array antenna 215 and the second array antenna 225 may rotate a beam in a short-axis direction. Since the second array antenna 225 is disposed to be adjacent to the first array antenna 215 in the short-axis direction (the upward direction or the downward direction in FIG. 7B) with reference to the first array antenna 215, a beam can be rotated in the short-axis direction. When the beam is rotated in the short-axis direction, the first array antenna 215 may configure a phase delay value different from that configured by the second array antenna 225. For example, when the beam is rotated in the upward direction, the first array antenna 215 may configure a 0-degree phase delay value for the first PS to the fourth PS, and the second array antenna 225 may configure a 90-degree phase delay value for the fifth PS to the eighth PS. Since a signal generated from the second array antenna 225 positioned at the upper side is further delayed by 90 degrees than a signal generated from the first array antenna 215, a beam may be tilted in the upward direction. Therefore, when the electronic device 101 is in the folded state, a beam can be rotated in the long-axis direction based on a phase difference between antenna elements included in one array antenna as well as in the short-axis direction based on a phase difference between array antennas arranged parallel to each other. Thus, the coverage of the beam may be increased.

Figure 8A:
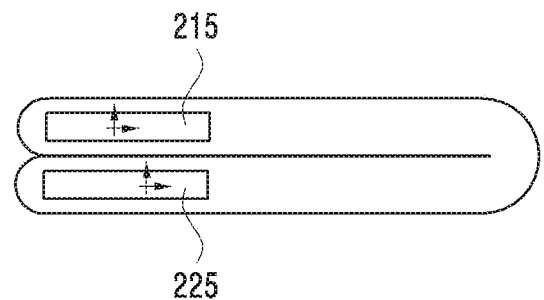
FIGS. 8A, 8B and 8C are diagrams illustrating one example of forming a beam in a folded state of an electronic device according to various embodiments of the disclosure.
Figure 8B:
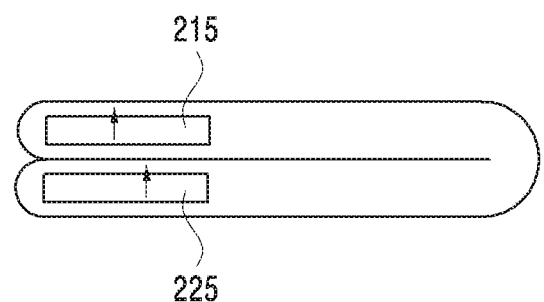
Figure 8C:
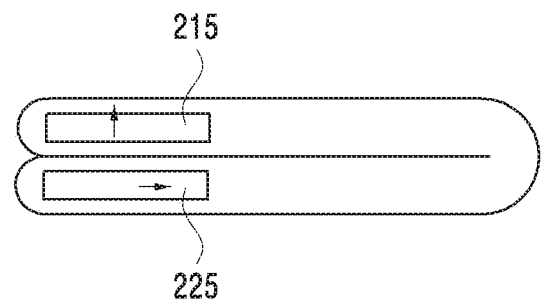

FIGS. 8A to 8C are diagrams illustrating one example of forming a beam in a folded state of an electronic device according to various embodiments of the disclosure.

According to an embodiment, when the electronic device 101 is in a folded state, the first array antenna 215 and the second array antenna 225 may be arranged parallel to each other in a long-axis direction.

Referring to FIG. 8A, the first array antenna 215 and the second array antenna 225 may correspond to dual polarization antennas. For example, a signal generated from the first array antenna 215 and a signal generated from the second array antenna 225 may correspond to signals polarized in both the vertical direction and the horizontal direction.

According to an embodiment, transmitting or receiving the dual-polarized signals by the first array antenna 215 and the second array antenna 225 may be substantially identical to transmitting or receiving a dual-polarized signal by a 2×4 array antenna. Therefore, the first array antenna 215 and the second array antenna 225 may form beams on the basis of the dual-polarized signals, and the beams may be capable of being rotated in a long-axis direction and in a short-axis direction.

Referring to FIG. 8B, the first array antenna 215 and the second array antenna 225 may correspond to vertical polarization antennas. For example, a signal generated from the first array antenna 215 and a signal generated from the second array antenna 225 may correspond to vertically polarized signals, respectively.

According to an embodiment, transmitting or receiving the vertically polarized signals by the first array antenna 215 and the second array antenna 225 may be substantially identical to transmitting or receiving a vertically polarized signal by a 2×4 array antenna. Therefore, the first array antenna 215 and the second array antenna 225 may form beams on the basis of the vertically polarized signals, and the formed beams may be capable of being rotated in a long-axis direction and in a short-axis direction.

In the above-described embodiment, FIG. 8B illustrates an example of transmitting or receiving vertically polarized signals, but is not limited thereto. For example, the first array antenna 215 and the second array antenna 225 may correspond to horizontal polarization antennas. In this instance, transmitting or receiving horizontally polarized signals by the first array antenna 215 and the second array antenna 225 may be substantially identical to transmitting or receiving a horizontally polarized signal by a 2×4 array antenna. Therefore, the first array antenna 215 and the second array antenna 225 may form beams on the basis of the horizontally polarized signals, and the formed beams may be capable of being rotated in the long-axis direction and in the short-axis direction.

Referring to FIG. 8C, the first array antenna 215 may correspond to a vertical polarization antenna, and the second array antenna 225 may correspond to a horizontal polarization antenna. For example, a signal generated from the first array antenna 215 may be polarized in a vertical direction, and a signal generated from the second array antenna 225 may be polarized in a horizontal direction. According to the characteristics of the polarized signals, the vertical polarization antenna cannot detect the horizontally polarized signal, and the horizontal polarization antenna cannot detect the vertically polarized signal. Therefore, the first array antenna 215 and the second array antenna 225 are arranged similarly to a 2×4 array antenna when the electronic device 101 is in a folded state, but may substantially correspond to a 1×4 array antenna. The first array antenna 215 and the second array antenna 225, which are orthogonal to each other, may form beams on the basis of signals polarized to be orthogonal to each other, and the formed beams may be capable of being rotated in the long-axis direction.

Figure 9:
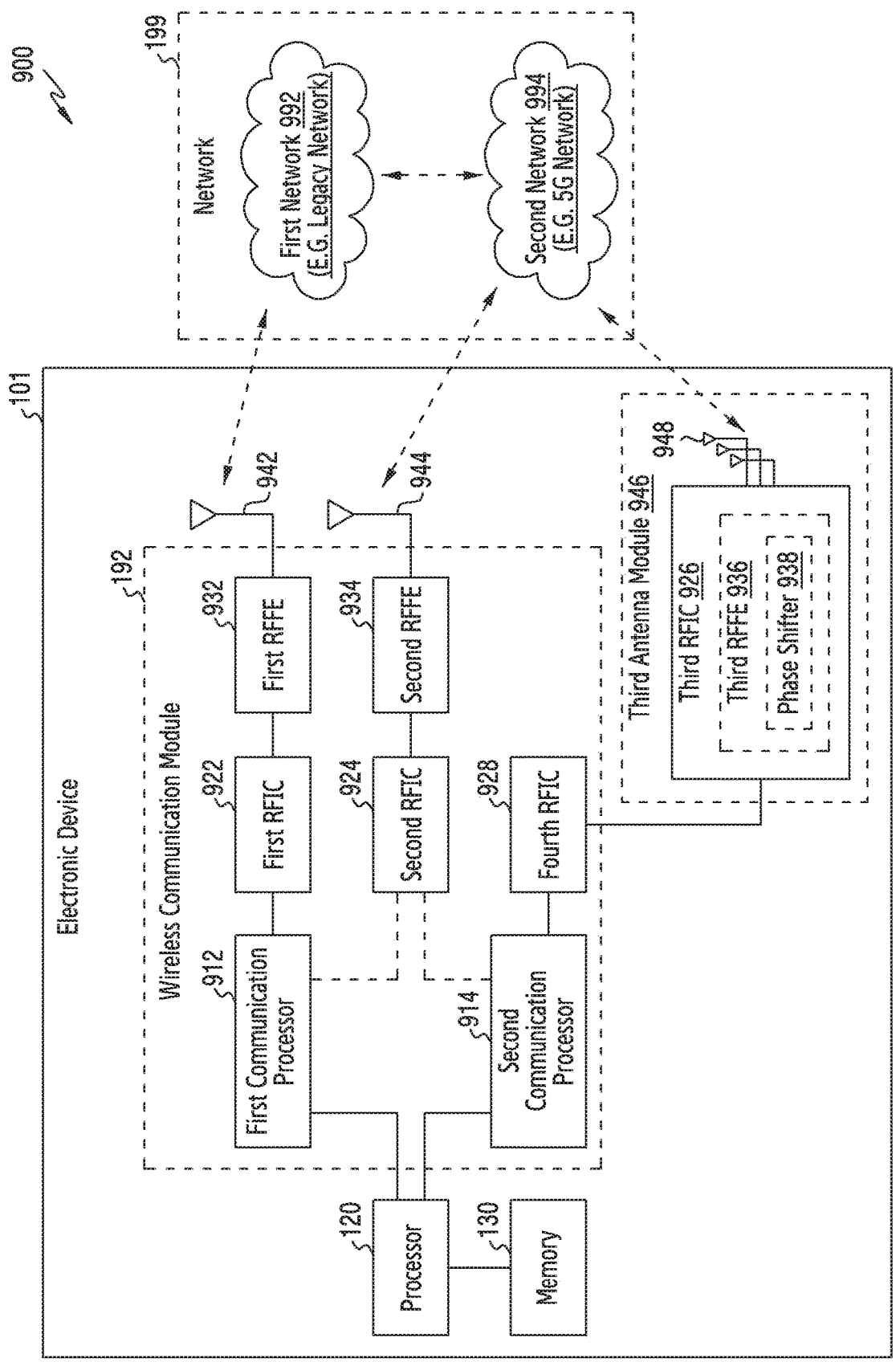
FIG. 9 is a block diagram of an electronic device for supporting legacy network communication and $5^{th}$ generation (5G) network communication according to an embodiment of the disclosure.

FIG. 9 is a block diagram 900 of the electronic device 101 for supporting legacy network communication and 5G network communication according to an embodiment of the disclosure.

Referring to FIG. 9, the electronic device 101 may include a first communication processor 912, a second communication processor 914, a first radio-frequency integrated circuit (RFIC) 922, a second RFIC 924, a third RFIC 926, a fourth RFIC 928, a first radio-frequency front end (RFFE) 932, a second RFFE 934, a first antenna module 942, a second antenna module 944, and an antenna 948. The electronic device 101 may further include the processor 120 and the memory 130. The network 199 may include a first network 992 and a second network 994. According to another embodiment, the electronic device 101 may further include at least one of the components shown in FIG. 1, and the network 199 may further include at least another network. According to one embodiment, the first communication processor 912, the second communication processor 914, the first RFIC 922, the second RFIC 924, the fourth RFIC 928, the first RFFE 932, and the second RFFE 934 may constitute at least a part of the wireless communication module 192. According to another embodiment, the fourth RFIC 928 may be omitted, or may be included as a part of the third RFIC 926.

The first communication processor 912 may establish a communication channel for a band to be used for wireless communication with the first network 992, and may support legacy network communication through the established communication channel. According to an embodiment, the first network may be a legacy network including a 2G, 3G, 4G, or long-term-evolution (LTE) network. The second communication processor 914 may establish a communication channel corresponding to a band (e.g., from about 6 GHz to about 60 GHz) designated among bands to be used for wireless communication with the second network 994, and may support 5G network communication through the established communication channel. According to an embodiment, the second network 994 may be a 5G network defined in the 3GPP. Additionally, according to one embodiment, the first communication processor 912 or the second communication processor 914 may establish a communication channel corresponding to a band (e.g., about 6 GHz) designated among bands to be used for wireless communication with the second network 994, and may support 5G network communication through the established communication channel. According to one embodiment, the first communication processor 912 and the second communication processor 914 may be implemented in a single chip or a single package. According to an embodiment, the first communication processor 912 or the second communication processor 914 may be disposed in a single chip or a single package together with the processor 120, the auxiliary processor 123, or the communication module 190.

At the time of signal transmission, the first RFIC 222 may convert a baseband signal generated by the first communication processor 912 into a radio-frequency (RF) signal of about 700 MHz to about 3 GHz used for the first network 992 (e.g., a legacy network). At the time of signal reception, the RF signal may be acquired from the first network 992 (e.g., a legacy network) through an antenna (e.g., the first antenna module 942), and may be preprocessed through an RFFE (e.g., the first RFFE 932). The first RFIC 922 may convert the preprocessed RF signal into a baseband signal that can be processed by the first communication processor 912.

At the time of signal transmission, the second RFIC 924 may convert a baseband signal generated by the first communication processor 912 or the second communication processor 914 into an RF signal (hereinafter, a 5G Sub6 RF signal) of a Sub6 band (e.g., about 6 GHz or less) used for the second network 994 (e.g., a 5G network). At the time of signal reception, the 5G Sub6 RF signal may be acquired from the second network 994 (e.g., a 5G network) through an antenna (e.g., the second antenna module 944), and may be preprocessed through an RFFE (e.g., the second RFFE 934). The second RFIC 924 may convert the preprocessed 5G Sub6 RF signal into a baseband signal that can be processed by a corresponding communication processor among the first communication processor 912 and the second communication processor 914.

The third RFIC 926 may convert a baseband signal generated by the second communication processor 914 into an RF signal (hereinafter, a 5G Above6 RF signal) of a 5G Above6 band (e.g., from about 6 GHz to about 60 GHz) to be used in the second network 994 (e.g., a 5G network). At the time of signal reception, the 5G Above6 RF signal may be acquired from the second network 994 (e.g., a 5G network) through an antenna (e.g., the antenna 948), and may be preprocessed through the third RFFE 936. The third RFIC 926 may convert the preprocessed 5G Above6 RF signal into a baseband signal that can be processed by the second communication processor 914. According to one embodiment, the third RFFE 936 may be configured as a part of the third RFIC 926.

According to one embodiment, the electronic device 101 may include the fourth RFIC 928 separately from the third RFIC 926 or as at least a part thereof. The fourth RFIC 928 may convert a baseband signal generated by the second communication processor 914 into an RF signal of an intermediate frequency band (e.g., from about 9 GHz to about 11 GHz) (hereinafter, an IF signal) and may then transmit the IF signal to the third RFIC 926. The third RFIC 926 may convert the IF signal into a 5G Above6 RF signal. At the time of signal reception, the 5G Above6 RF signal may be received from the second network 994 (e.g., a 5G network) through an antenna (e.g., the antenna 948), and may be converted into an IF signal by the third RFIC 926. The fourth RFIC 928 may convert the IF signal into a baseband signal that can be processed by the second communication processor 914.

According to one embodiment, the first RFIC 922 and the second RFIC 924 may be implemented as at least a part of a single package or a single chip. According to one embodiment, the first RFFE 932 and the second RFFE 934 may be implemented as at least a part of a single package or a single chip. According to one embodiment, at least one antenna module among the first antenna module 942 or the second antenna module 944 may be omitted, or may be combined with the other antenna module to process RF signals of multiple bands corresponding thereto.

According to one embodiment, the third RFIC 926 and the antenna 948 may be arranged on the same substrate to constitute a third antenna module 946. For example, the wireless communication module 192 or the processor 120 may be arranged on a first substrate (e.g., a main PCB). In this instance, the third antenna module 946 may be configured by arranging the third RFIC 926 in a partial area (e.g., a lower surface) of a second substrate (e.g., a sub PCB) independent of the first substrate and arranging the antenna 948 in another partial area (e.g., an upper surface) thereof. Arranging the third RFIC 926 and the antenna 948 on the same substrate can reduce the length of a transmission line therebetween. This arrangement may reduce, for example, the loss (e.g., attenuation) of a signal in a high-frequency band (e.g., from about 6 GH to about 60 GHz), used for 5G network communication, due to the transmission line. Therefore, the electronic device 101 may enhance the quality or speed of communication with the second network 994 (e.g., a 5G network).

According to one embodiment, the antenna 948 may be formed as an antenna array including multiple antenna elements which can be used for beamforming. In this instance, for example, the third RFIC 926 may include, as a part of the third RFFE 936, multiple phase shifters 938 corresponding to the multiple antenna elements. At the time of signal transmission, the multiple phase shifters 938 may shift the phases of 5G Above6 RF signals to be transmitted from the electronic device 101 to the outside (e.g., a base station of a 5G network) through antenna elements corresponding thereto. At the time of signal reception, the multiple phase shifters 938 may shift the phases of 5G Above6 RF signals received from the outside through antenna elements corresponding thereto into an identical or substantially identical phase. This enables transmission or reception through beamforming between the electronic device 101 and the outside.

The second network 994 (e.g., a 5G network) may be operated independently of the first network 992 (e.g., a legacy network) (e.g., standalone (SA)) or may be operated while being connected to the first network (e.g., non-standalone (NSA)). For example, the 5G network may include only an access network (e.g., a 5G radio access network (RAN) or next-generation RAN (NG RAN)) and may not include a core network (e.g., a next-generation core (NGC) network). In this instance, the electronic device 101 may access the access network of the 5G network and may then access an external network (e.g., the Internet) under the control of a core network (e.g., an evolved packed core (EPC) network) of the legacy network. Protocol information (e.g., LTE protocol information) for communication with the legacy network or protocol information (e.g., new radio (NR) protocol information) for communication with the 5G network is stored in a memory 930, and may be accessed by another component (e.g., the processor 120, the first communication processor 912, or the second communication processor 914).

The electronic device 101 according to an embodiment may include: a housing including a first portion 210, a second portion 220, and a third portion 230 configured to be movable such that the second portion is capable of being folded with respect to the first portion; a first array antenna disposed at the first portion and including a first antenna element and a second antenna element; a second array antenna including a third antenna element and a fourth antenna element, and disposed at the second portion such that the third antenna element is aligned with the first antenna element and the fourth antenna element is aligned with the second antenna element in the state in which the second portion of the housing is folded with respect to the first portion by using the third portion; a communication circuit electrically connected to the first array antenna and the second array antenna; and at least one processor, wherein the at least one processor may be configured to: determine whether the second portion is in an unfolded state or a folded state with respect to the first portion by using the third portion; when the second portion is in the unfolded state with respect to the first portion, form a first beam through the first antenna element and the second antenna element or a second beam through the third antenna element and the fourth antenna element by using the communication circuit; and when the second portion is in the folded state with respect to the first portion, form a third beam through the first antenna element and the third antenna element or a fourth beam through the second antenna element and the fourth antenna element by using the communication circuit.

The first portion according to an embodiment may further include a first printed circuit board (PCB) on which the first array antenna is disposed and on which at least a part of the communication circuit is disposed.

The second portion according to an embodiment may further include a second PCB on which the second array antenna is disposed and on which at least a part of the communication circuit is disposed.

According to an embodiment, the first antenna element and the third antenna element, which are aligned with each other, and the second antenna element and the fourth antenna element, which are aligned with each other, may be arranged to be spaced apart by a distance corresponding to half of a wavelength, respectively, when the first portion is in the folded state with respect to the second portion.

In an embodiment, the electronic device may further include: a third array antenna (e.g., the seventh array antenna 217 in FIG. 2) disposed at the first portion; and a fourth array antenna (e.g., the eighth array antenna 227 in FIG. 2) disposed at the second portion, wherein the first array antenna is disposed on a side surface of the first portion, the second array antenna is disposed on a side surface of the second portion that is disposed in a first direction faced by the side surface of the first portion faces, the third array antenna is disposed in another side surface of the first portion that is disposed in a second direction opposite to the first direction, and the fourth array antenna is disposed in another side surface of the second portion that is disposed in the second direction.

In an embodiment, the first antenna element and the second antenna element, included in the first array antenna, and the third antenna element and the fourth antenna element, included in the second array antenna, are arranged to be spaced apart from each other by a distance corresponding to half of a wavelength.

The electronic device 101 according to an embodiment may further include a memory configured to store a code book corresponding to the folded state, wherein the at least one processor is further configured to load, based on determination of the folded state, the code book corresponding to the folded state from the memory.

According to an embodiment, the at least one processor may be configured to form, based on the loaded code book, a third beam through the first antenna element and the third antenna element or a fourth beam through the second antenna element and the fourth antenna element by using the communication circuit.

The third portion according to an embodiment may further include at least one sensor configured to detect the folded state or the unfolded state.

The at least one sensor according to an embodiment may include at least one among a six-component sensor, a magnetic sensor, and a sensor including a switch.

The third portion according to an embodiment may include a hinge.

When the second portion is in the folded state with respect to the first portion, each of the first array antenna and the second array antenna according to an embodiment may correspond to one among a dual polarization antenna, a vertical polarization antenna, or a horizontal polarization antenna.

According to an embodiment, when the second portion is in the folded state with respect to the first portion, the first array antenna may correspond to a vertical polarization antenna and the second array antenna may correspond to a horizontal polarization antenna, or the first array antenna may correspond to a horizontal polarization antenna and the second array antenna may correspond to a vertical polarization antenna.

The at least one processor according to an embodiment may be configured to generate a beam in a vertical direction and a horizontal direction by using the first array antenna and the second array antenna.

The at least one processor according to an embodiment may be configured to generate a beam in a vertical direction and a horizontal direction by using the first array antenna and the second array antenna.

The first PCB or the second PCB according to an embodiment may correspond to a flexible PCB (FPCB).

According to an embodiment, the first portion may further include a third array antenna, the second portion may further include a fourth array antenna, the third array antenna and the fourth array antenna may be configured to form beams toward a rear surface of the electronic device, and the first array antenna and the second array antenna may be configured to form beams toward a side surface of the electronic device.

The at least one processor according to an embodiment may be configured to deactivate the third array antenna and the fourth array antenna in response to determination of the folded state, and to form the third beam or the fourth beam by using the first array antenna and the second array antenna.

According to an embodiment, the first antenna element and the second antenna element, included in the first array antenna, and the third antenna element and the fourth antenna element, included in the second array antenna, may correspond to dipole antennas, respectively.

According to an embodiment, multiple antenna elements included in each of the third array antenna and the fourth array antenna may correspond to patch antennas.

The electronic device 101 according to an embodiment may include: a first portion including a first array antenna and a third array antenna, a second portion including a second array antenna and a fourth array antenna, and a third portion connecting the first portion and the second portion and configured to rotate at least one of the first portion or the second portion; at least one sensor configured to detect a folded state of the electronic device or an unfolded state of the electronic device; a memory configured to store a code book corresponding to the folded state; and at least one processor, wherein the at least one processor may be configured to: acquire sensor data indicating one of the unfolded state or the folded state from the at least one sensor; determine, based on the sensor data, that the electronic device is in the folded state; deactivate the third array antenna and the fourth array antenna, based on the determination; and form, based on the code book corresponding to the folded state, a beam by using the first array antenna included in the first portion and the second array antenna included in the second portion as one array antenna.

According to an embodiment, the first array antenna and the second array antenna may be configured to form beams toward a side surface of the electronic device, and the third array antenna and the fourth array antenna may be configured to form beams toward a rear surface of the electronic device.

According to an embodiment, when the electronic device is in the folded state, each of the first array antenna and the second array antenna corresponds to one of a dual polarization antenna, a vertical polarization antenna, or a horizontal polarization antenna.

According to an embodiment, the at least one processor is configured to generate a beam in a vertical direction and a horizontal direction by using the first array antenna and the second array antenna.

According to an embodiment, when the electronic device is in the folded state, the first array antenna corresponds to a vertical polarization antenna and the second array antenna corresponds a horizontal polarization antenna, or the first array antenna corresponds to a horizontal polarization antenna and the second array antenna corresponds to a vertical polarization antenna.

According to an embodiment, the at least one processor is configured to generate a beam in a vertical direction and a horizontal direction by using the first array antenna and the second array antenna.

Methods according to various example embodiments of the present disclosure may be implemented in hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Any combination of some or all of them may form a memory in which the program is stored. Further, a plurality of such memories may be included in the electronic device.

In addition, the programs may be stored in an attachable storage device which is accessible through communication networks such as the Internet, Intranet, local area network (LAN), wide area network (WAN), and storage area network (SAN), or a combination thereof. Such a storage device may access the electronic device via an external port. Further, a separate storage device on the communication network may access a portable electronic device.

Further, either multiple elements expressed in the description may be configured into a single element or a single element in the description may be configured into multiple elements.

While the disclosure has been illustrated and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing comprising a first portion, a second portion, and a third portion configured to be movable such that the second portion is capable of being folded with respect to the first portion;
   a first array antenna disposed at the first portion and comprising a first antenna element and a second antenna element;
   a second array antenna comprising a third antenna element and a fourth antenna element, and disposed at the second portion such that the third antenna element is aligned with the first antenna element and the fourth antenna element is aligned with the second antenna element when the electronic device is in a folded state in which the second portion of the housing is folded with respect to the first portion by using the third portion;
   a communication circuit electrically connected to the first array antenna and the second array antenna; and
   at least one processor,
   wherein the at least one processor is configured to:
      determine whether the electronic device is in an unfolded state or a folded state based on the second portion being in the unfolded state or folded state with respect to the first portion by using the third portion;
      when the electronic device is in the unfolded state, form a first beam through the first antenna element and the second antenna element or a second beam through the third antenna element and the fourth antenna element by using the communication circuit; and
      when the electronic device is in the folded state, form a third beam through the first antenna element and the third antenna element or a fourth beam through the second antenna element and the fourth antenna element by using the communication circuit.

2. The electronic device of claim 1, wherein the first portion further comprises a first printed circuit board (PCB) on which the first array antenna is disposed and on which at least a part of the communication circuit is disposed.

3. The electronic device of claim 2, wherein the second portion further comprises a second PCB on which the second array antenna is disposed and on which at least a part of the communication circuit is disposed.

4. The electronic device of claim 3, wherein at least one of the first PCB or the second PCB corresponds to a flexible PCB (FPCB).

5. The electronic device of the claim 1, further comprising:
   a third array antenna disposed at the first portion; and
   a fourth array antenna disposed at the second portion,
   wherein the first array antenna is disposed on a side surface of the first portion, the second array antenna is disposed on a side surface of the second portion that is disposed in a first direction which the side surface of the first portion faces, the third array antenna is disposed in another side surface of the first portion that is disposed in a second direction opposite to the first direction, and the fourth array antenna is disposed in another side surface of the second portion that is disposed in the second direction.

6. The electronic device of claim 1, wherein the first antenna element and the second antenna element, included in the first array antenna, and the third antenna element and the fourth antenna element, included in the second array antenna, are arranged to be spaced apart from each other by a distance corresponding to half of a wavelength.

7. The electronic device of claim 1, further comprising a memory configured to store a code book corresponding to the folded state, wherein the at least one processor is further configured to load, based on a determination that the electronic device is in the folded state, the code book corresponding to the folded state from the memory.

8. The electronic device of claim 1, wherein the third portion further comprises at least one sensor configured to detect the folded state or the unfolded state.

9. The electronic device of claim 8, wherein the at least one sensor comprises at least one of a six-component sensor, a magnetic sensor, or a sensor comprising a switch.

10. The electronic device of claim 1, wherein the third portion comprises a hinge.

11. The electronic device of claim 1, wherein, when the electronic device is in the folded state, each of the first array antenna and the second array antenna corresponds to one of a dual polarization antenna, a vertical polarization antenna, or a horizontal polarization antenna.

12. The electronic device of claim 11, wherein the at least one processor is configured to generate a beam in a vertical direction and a horizontal direction by using the first array antenna and the second array antenna.

13. The electronic device of claim 1, wherein, when the electronic device is in the folded state, the first array antenna corresponds to a vertical polarization antenna and the second array antenna corresponds a horizontal polarization antenna, or the first array antenna corresponds to a horizontal polarization antenna and the second array antenna corresponds to a vertical polarization antenna.

14. The electronic device of claim 13, wherein the at least one processor is configured to generate a beam in a vertical direction and a horizontal direction by using the first array antenna and the second array antenna.

15. The electronic device of claim 1, wherein the first portion further comprises a third array antenna, the second portion further comprises a fourth array antenna, the third array antenna and the fourth array antenna are configured to form beams toward a rear surface of the electronic device, and the first array antenna and the second array antenna are configured to form beams toward a side surface of the electronic device.

16. The electronic device of claim 15, wherein the at least one processor is configured to deactivate the third array antenna and the fourth array antenna in response to a determination that the electronic device is the folded state, and to form the third beam or the fourth beam by using the first array antenna and the second array antenna.

17. The electronic device of claim 15, wherein the first antenna element and the second antenna element, included in the first array antenna, and the third antenna element and the fourth antenna element, included in the second array antenna, correspond to dipole antennas.

18. The electronic device of claim 15, wherein multiple antenna elements included in each of the third array antenna and the fourth array antenna correspond to patch antennas.

19. An electronic device comprising:
   a first portion comprising a first array antenna and a third array antenna;
   a second portion comprising a second array antenna and a fourth array antenna;
   a third portion connecting the first portion and the second portion and configured to rotate at least one of the first portion or the second portion;
   at least one sensor configured to detect a folded state of the electronic device or an unfolded state of the electronic device;
   a memory configured to store a code book corresponding to the folded state; and
   at least one processor,
   wherein the at least one processor is configured to:
      acquire sensor data indicating one of the unfolded state or the folded state from the at least one sensor;
      determine, based on the sensor data, that the electronic device is in the folded state;
      deactivate the third array antenna and the fourth array antenna, based on the determination; and
      form, based on the code book corresponding to the folded state, a beam by using the first array antenna included in the first portion and the second array antenna included in the second portion as one array antenna.

20. The electronic device of claim 19, wherein the first array antenna and the second array antenna are configured to form beams toward a side surface of the electronic device, and the third array antenna and the fourth array antenna are configured to form beams toward a rear surface of the electronic device.

\* \* \* \* \*